(12) United States Patent
Hsieh

(10) Patent No.: US 10,749,290 B2
(45) Date of Patent: Aug. 18, 2020

(54) WATERPROOF ASSEMBLY

(71) Applicant: ACCTON TECHNOLOGY CORPORATION, Hsinchu (TW)

(72) Inventor: Chih-Chang Hsieh, Hsinchu (TW)

(73) Assignee: ACCTON TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/529,824

(22) Filed: Aug. 2, 2019

(65) Prior Publication Data

US 2020/0106208 A1 Apr. 2, 2020

(30) Foreign Application Priority Data

Sep. 28, 2018 (TW) .............................. 107213286 U

(51) Int. Cl.
*H01R 13/52* (2006.01)

(52) U.S. Cl.
CPC ..... *H01R 13/5202* (2013.01); *H01R 13/5216* (2013.01)

(58) Field of Classification Search
CPC .................. H01R 13/5202; H01R 13/5216
See application file for complete search history.

(56) References Cited

U.S. PATENT DOCUMENTS

| 4,825,023 | A * | 4/1989 | Morse | H01H 13/063 200/302.2 |
|---|---|---|---|---|
| 6,717,082 | B1 * | 4/2004 | Wu | H01H 13/063 200/302.2 |
| 7,230,196 | B2 * | 6/2007 | Toyama | H01H 13/023 200/314 |
| 7,420,136 | B2 * | 9/2008 | Goetzl | H01H 13/06 200/302.2 |
| 7,439,464 | B2 * | 10/2008 | Yamamoto | B60Q 1/441 200/302.1 |
| 7,642,476 | B2 * | 1/2010 | Virtanen | H01H 13/06 200/302.1 |
| 7,964,812 | B1 * | 6/2011 | Schwinn | H01H 9/04 200/302.3 |
| 8,575,506 | B2 * | 11/2013 | Kitahara | H01H 13/06 200/302.2 |
| 8,637,781 | B2 * | 1/2014 | Derengowski | H01H 13/063 200/293 |
| 8,766,119 | B2 * | 7/2014 | Cotha | H01H 13/06 200/302.2 |
| 8,834,454 | B2 * | 9/2014 | Genosar | A61M 5/14248 604/890.1 |
| 8,902,599 | B2 * | 12/2014 | Chao | H05K 5/069 174/142 |

(Continued)

*Primary Examiner* — Alexander Gilman
(74) *Attorney, Agent, or Firm* — CKC Partners Co., LLC

(57) ABSTRACT

A waterproof assembly includes a casing, a gasket, and a cap. The casing has an opening. The gasket includes a main body and a protruding portion. The main body has a first circular raised structure configured to abut against an inner surface of the casing. The protruding portion is connected to the main body and is configured to at least partially protrude out of the casing through the opening. The cap is configured to abut against a side of the main body away from the opening. The cap has a through hole configured to be aligned with the protruding portion. The casing further has a plurality of fixing members configured to abut against a side of the cap away from the gasket.

9 Claims, 8 Drawing Sheets

(56) References Cited

U.S. PATENT DOCUMENTS

| | | | |
|---|---|---|---|
| 8,963,030 B2* | 2/2015 | Kitahara | H01H 13/52 |
| | | | 200/293 |
| D813,829 S * | 3/2018 | Raphael | D13/177 |
| 2014/0262712 A1* | 9/2014 | Chu | H01H 13/06 |
| | | | 200/302.2 |
| 2017/0213670 A1* | 7/2017 | Okano | H01H 25/04 |
| 2017/0287656 A1* | 10/2017 | Rong | H01H 13/06 |

* cited by examiner

WATERPROOF ASSEMBLY

RELATED APPLICATIONS

This application claims priority to Taiwan Application Serial Number 107213286, filed Sep. 28, 2018, the disclosure of which is incorporated herein by reference in its entirety.

BACKGROUND

Technical Field

The present disclosure relates to a waterproof assembly, and particularly to a waterproof assembly applied to an outdoor network device.

Description of Related Art

Outdoor electronic devices are required to be waterproof and dustproof, so as to function normally under bad weather conditions such as rain. Buttons of outdoor electronic devices are usually equipped with waterproof structures to prevent liquid from penetrating through the gaps of the casings. Outdoor electronic devices that are commercially available usually implement waterproof function by adding a waterproof cover on the outside of a button. A drawback of such approach is inconvenience, as the waterproof cover has to be opened each time before using the button, and has to be closed after that.

In addition, there are also waterproof techniques involving the usage of waterproof gaskets. However, waterproof gaskets are required to be fixed into place by screwing through assembly, making electronic devices inconvenient to assemble. Furthermore, screwing renders waterproof gaskets prone to deformation and become loose after being used for a period of time, thereby affecting their waterproof capability.

Consequently, how to provide a waterproof assembly to resolve the aforementioned issues is one of the directions that should be urgently endeavored.

SUMMARY

In view of the foregoing, one of the objects of the present disclosure is to provide a waterproof assembly that takes into account ease of operation, ease of assembly, and durability.

To achieve the objective stated above, in accordance with an embodiment of the present disclosure, a waterproof assembly includes a casing, a gasket, and a cap. The casing has an opening. The gasket includes a main body and a protruding portion. The main body has a first circular raised structure configured to abut against an inner surface of the casing. The protruding portion is connected to the main body and is configured to at least partially protrude out of the casing through the opening. The cap is configured to abut against a side of the main body away from the opening. The cap has a through hole configured to be aligned with the protruding portion. The casing further has a plurality of fixing members configured to abut against a side of the cap away from the gasket.

In one of more embodiments of the present disclosure, the casing further has a second circular raised structure disposed on the inner surface of the casing and surrounding the opening. The first circular raised structure and the second circular raised structure are configured to abut against each other.

In one of more embodiments of the present disclosure, a peripheral edge of the cap has a plurality of notches.

In one of more embodiments of the present disclosure, the cap further has a guiding bevel connected to an end of one of the notches. One of the fixing members is configured to abut against and move along the guiding bevel.

In one of more embodiments of the present disclosure, the cap further has a recess facing towards the gasket. The main body of the gasket is configured to be accommodated in the recess and abut against a bottom surface of the recess.

In one of more embodiments of the present disclosure, the main body has a thickness. A depth of the recess is in a range between 65% and 85% of the thickness of the main body.

In one of more embodiments of the present disclosure, the cap further has an engaging slot configured to engage with one of the fixing members.

In one of more embodiments of the present disclosure, the cap further has a plurality of pushable flakes protruding from a top surface of the cap, with the top surface facing away from the gasket.

In one of more embodiments of the present disclosure, the main body surrounds and connects the protruding portion. The first circular raised structure surrounds the protruding portion.

In one of more embodiments of the present disclosure, a material of the gasket includes silicone rubber.

In accordance with an embodiment of the present disclosure, a waterproof assembly applied to an outdoor network device includes a casing, a gasket, a cap, and a circuit board. The casing has an opening. The gasket includes a main body and a protruding portion. The main body has a first circular raised structure configured to abut against an inner surface of the casing. The protruding portion is connected to the main body and is configured to at least partially protrude out of the casing through the opening. The cap is configured to abut against a side of the main body away from the opening. The cap has a through hole configured to be aligned with the protruding portion. The circuit board is disposed inside the casing. The circuit board has a button configured to pass through the through hole and extend to an inner side of the protruding portion. The casing further has a plurality of fixing members configured to abut against a side of the cap away from the gasket.

In sum, the waterproof assembly of the present disclosure utilizes the cap to press the gasket, thereby sealing the button opening on the casing. The cap is not only easy to install and remove, but it also does not excessively squash the gasket, thereby allowing the lifespan of the gasket to be extended.

BRIEF DESCRIPTION OF THE DRAWINGS

To make the objectives, features, advantages, and examples of the present invention, including those mentioned above and others, more comprehensible, descriptions of the accompanying drawings are provided as follows.

DETAILED DESCRIPTION

Figure 1:
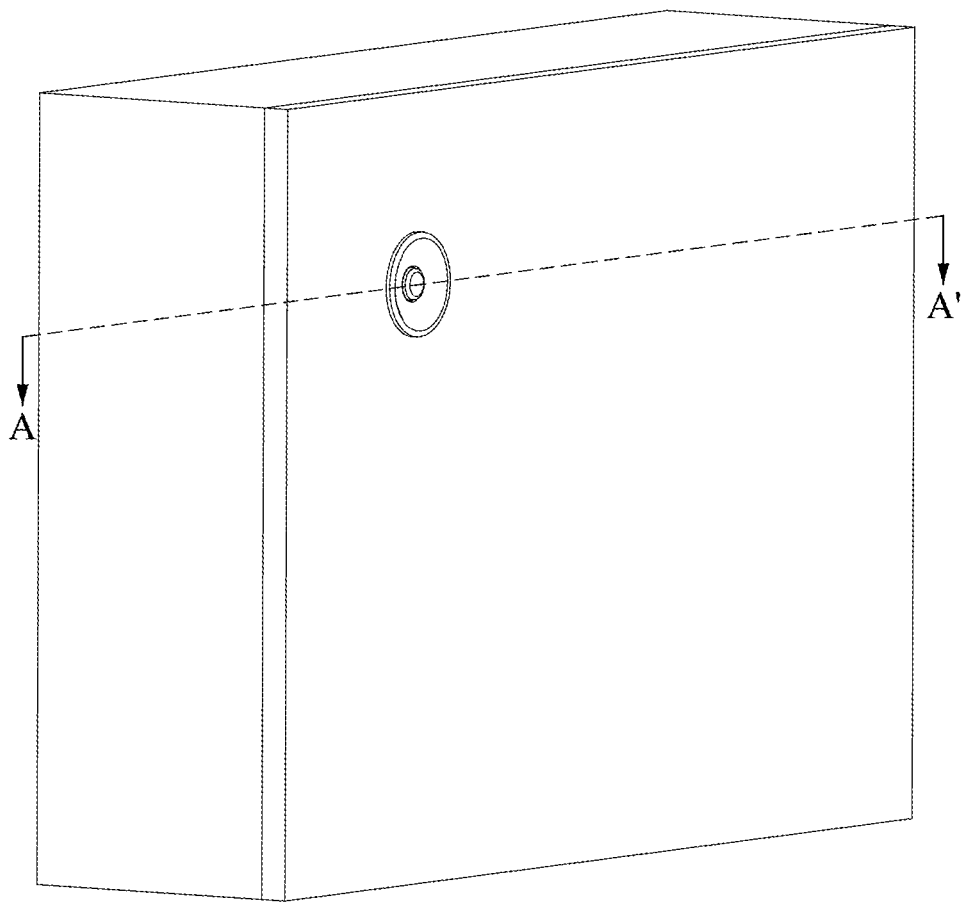
FIG. 1 illustrates an assembled view of a waterproof assembly in accordance with an embodiment of the present disclosure.

For the sake of the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, these details should not be used to limit the present disclosure.

Figure 2:
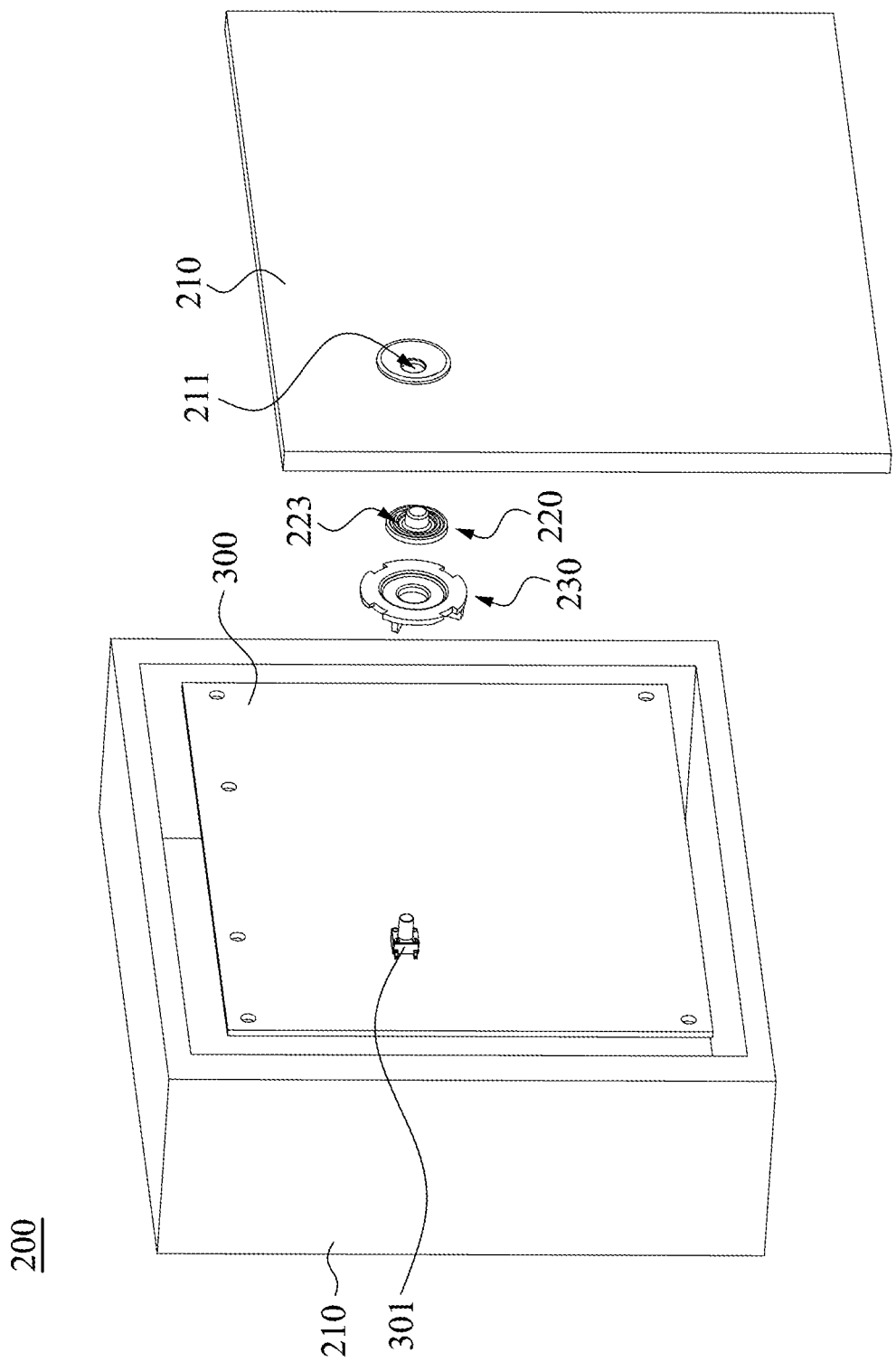
FIG. 2 is an exploded view of the waterproof assembly shown in FIG. 1 taken from a view angle.
Figure 3:
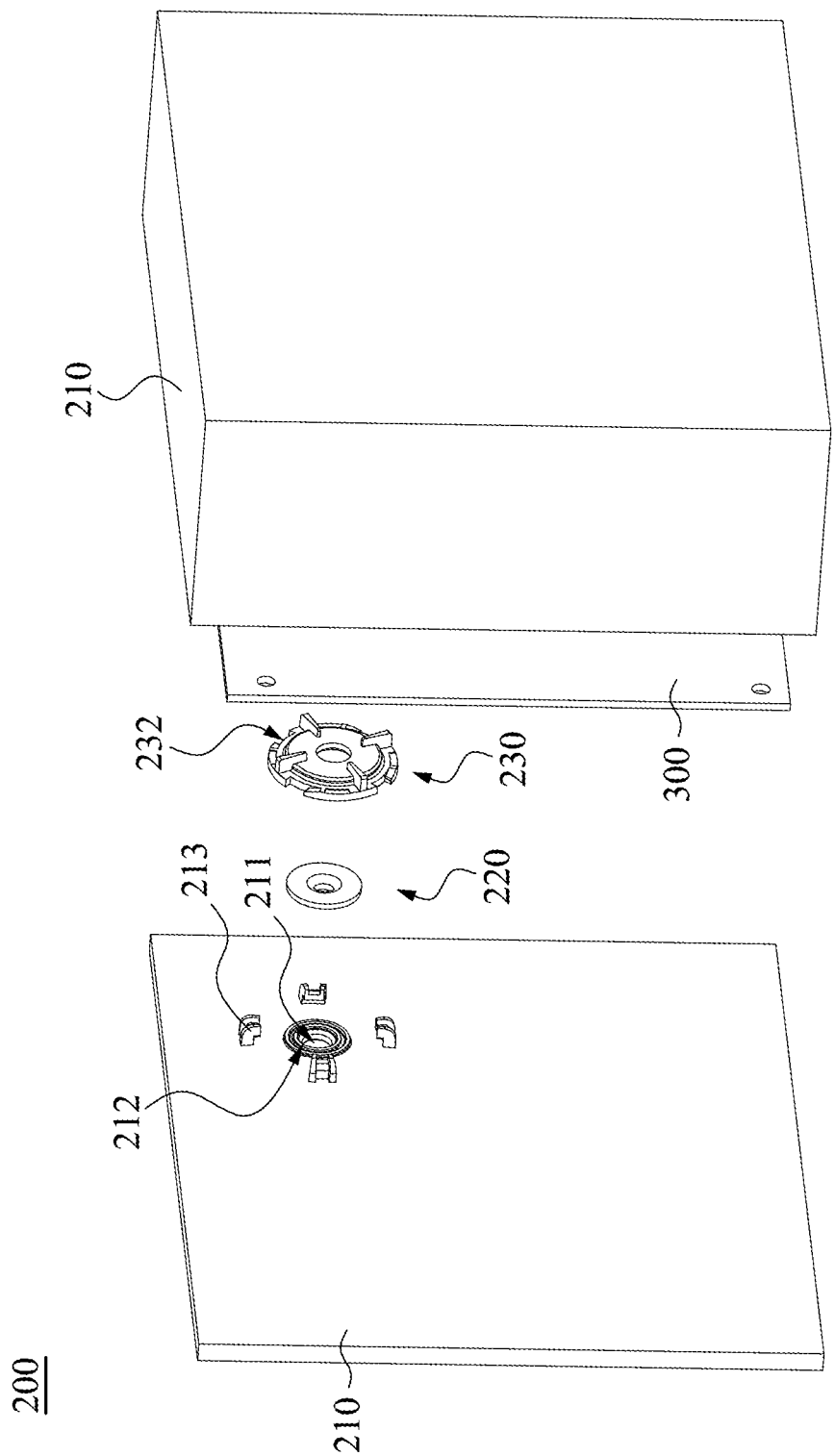
FIG. 3 is an exploded view of the waterproof assembly shown in FIG. 1 take from another view angle.

Please refer to FIGS. 1-3. FIG. 1 illustrates an assembled view of a waterproof assembly 200 in accordance with an embodiment of the present disclosure. FIGS. 2 and 3 are exploded views of the waterproof assembly 200 shown in FIG. 1 taken from different view angles. The waterproof assembly 200 is applicable to an outdoor network device such as an access point (AP), but the present disclosure is not limited thereto. As shown in FIG. 2, the waterproof assembly 200 includes a casing 210, a gasket 220, a cap 230, and a circuit board 300. The circuit board 300 is disposed inside the casing 210 and has a button 301 which may be a reset button of the access point. The casing 210, the gasket 220, and the cap 230 are configured to protect the circuit board 300 from water and dust, so as to ensure that the circuit board 300 can function normally in humid environments (e.g., outdoors).

Figure 4:
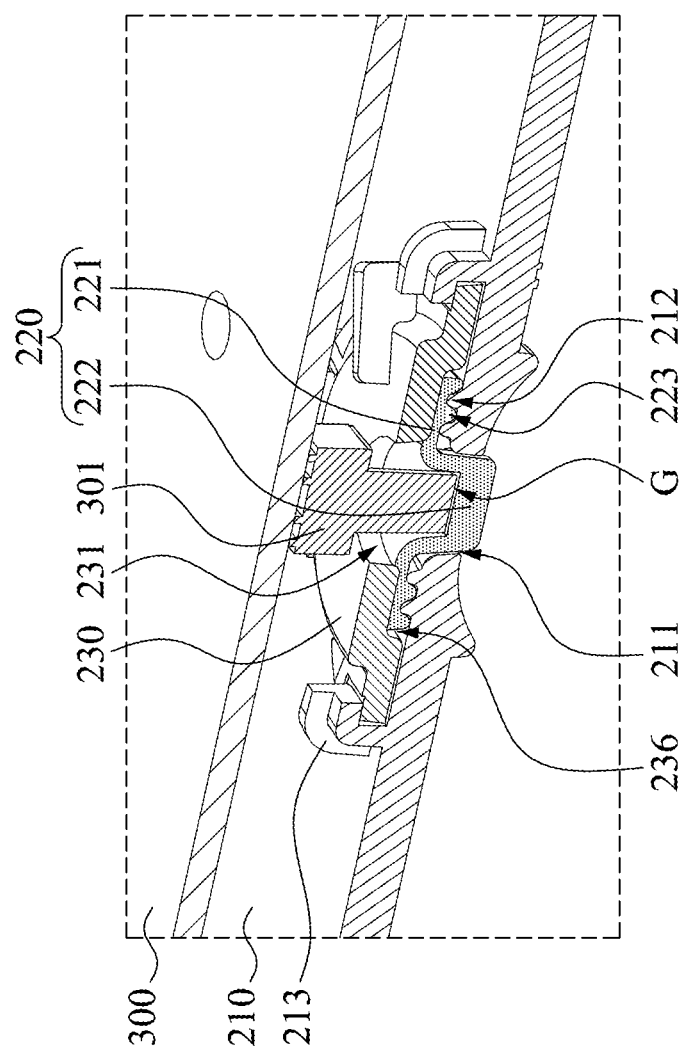
FIG. 4 is a partially enlarged cross-sectional view of the waterproof assembly taken along line A-A' shown in FIG. 1.

Please refer to FIG. 4, which is a partially enlarged cross-sectional view of the waterproof assembly 200 taken along line A-A' shown in FIG. 1. The casing 210 has an opening 211 facing towards the button 301. The gasket 220 seals the opening 211 from the inside of the casing 210 and partially extends out of the casing 210. Users are therefore able to press the button 301 through the gasket 220.

As shown in FIG. 4, the gasket 220 includes a main body 221 and a protruding portion 222 elevated from the center of the main body 221. In other words, the main body 221 surrounds and connects the protruding portion 222. The main body 221 is located inside the casing 210 and abuts against an area of the inner surface of the casing 210 surrounding the opening 211. The protruding portion 222 at least partially protrudes out of the casing through the opening 211. The button 301 extends to an inner side of the protruding portion 222, thereby allowing the users to actuate the button 301 by pressing the portion of the protruding portion 222 exposed outside the casing 210.

As shown in FIG. 4, the main body 221 of the gasket 220 has a plurality of first circular raised structures 223 (also refer to FIG. 2) surrounding the protruding portion 222. The casing 210 has a plurality of second circular raised structures 212 (also refer to FIG. 3). The second circular raised structures 212 are disposed on the inner surface of the casing 210 and surround the opening 211. The first circular raised structures 223 and the second circular raised structures 212 are staggered and tightly abut against each other to seal the opening 211, so as to prevent liquid from entering the casing 210 through the opening 211.

In some embodiments, the second circular raised structures 212 may be replaced with a plurality of circular depressed structures (not shown) surrounding the opening 211. The circular depressed structures and the first circular raised structures 223 are aligned and tightly abut against each other to provide waterproof function.

A person with an ordinary skill in relevant art may adjust the quantities and the heights of the first circular raised structures 223 and the second circular raised structures 212 based on practical applications. For example, if the waterproof assembly 200 is only required to protect against splashing of water, then the number of the first circular raised structures 223/the second circular raised structures 212 may be lowered, and/or the height of the first circular raised structures 223/the second circular raised structures 212 may be reduced.

In some embodiments, the materials of the gasket 220 include silicone rubber. Therefore, the gasket 220 has excellent ultraviolet resistance capability and is less likely to degrade after long-term outdoor exposure.

In some embodiments, a hardness of the gasket 220 is substantially 60 Shore A. The hardness provided above is merely illustrated as an example. The present disclosure is not limited thereto. A person with an ordinary skill in relevant art may use different hardness of the gasket 220 based on practical applications. For example, harder gasket 220 may have lower likelihood of inadvertent actuation of the button 301.

In some embodiments, as shown in FIG. 4, the button 301 and the protruding portion 222 of the gasket 220 are not in direct contact. A gap G is located between the button 301 and the protruding portion 222. The gap G act as a buffer which avoids actuation of the button 301 (especially switches with short strokes) when the gasket 220 is gently pushed. Secondly, the gap G renders the waterproof assembly 200 adaptive to manufacturing variations of buttons 301. Buttons 301 with longer dimensions may be prevented from being abutted by the gasket 220 and inadvertently being actuated.

As shown in FIG. 4, the cap 230 abuts against a side of the main body 221 away from the opening 211 of the casing 210 such that the main body 221 is compressed between the casing 210 and the cap 230. The cap 230 has a through hole 231 aligned with the protruding portion 222. The button 301 passes through the through hole 231 and extends to the inner side of the protruding portion 222.

As shown in FIG. 4, the casing 210 has a plurality of fixing members 213 disposed on its inner surface (also refer to FIG. 3) and abutting against the side of the cap 230 away from the gasket 220. The fixing members 213 are utilized to fasten and press the cap 230, and the cap 230 in turn squashes the main body 221 of the gasket 220. As a result, the main body 221 and the casing 210 are kept in a tightly fitted state to maintain the waterproof capability of the waterproof assembly 200.

Please refer back to FIG. 3. In some embodiments, the cap 230 is rotatable, and a peripheral edge of the cap 230 has a plurality of notches 232. Each of the notches 232 is configured to allow a corresponding one of the fixing members 213 to pass through during the assembling the waterproof assembly 200. Although the cap 230 is shown with four notches 232 and the casing 210 is shown with four corresponding fixing members 213 in FIG. 3, the present disclosure is not limited thereto.

In some embodiments, as shown in FIG. 3, the cap 230 is substantially plate-shaped. The notches 232 are uniformly spaced apart from each other on the peripheral edge of the cap 230. The fixing members 213 are evenly arranged around the opening 211 with a fixed angle, making it easier to align the notches 232 with the fixing members 213 during assembling the waterproof assembly 200. The steps for assembling the waterproof assembly 200 will be described in detail below.

Figure 5:
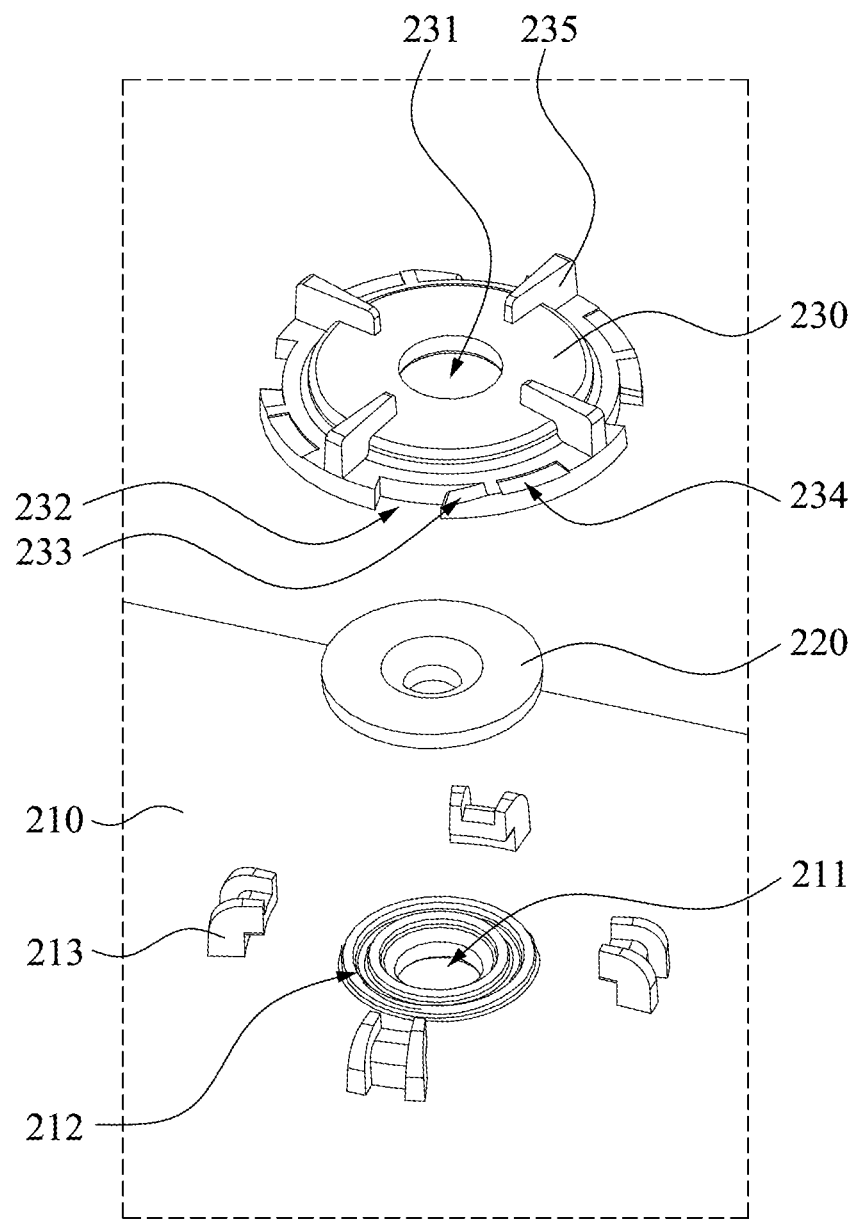
FIGS. 5-8 illustrate some members of the waterproof assembly shown in FIG. 1 at different stages during assembly.
Figure 6:
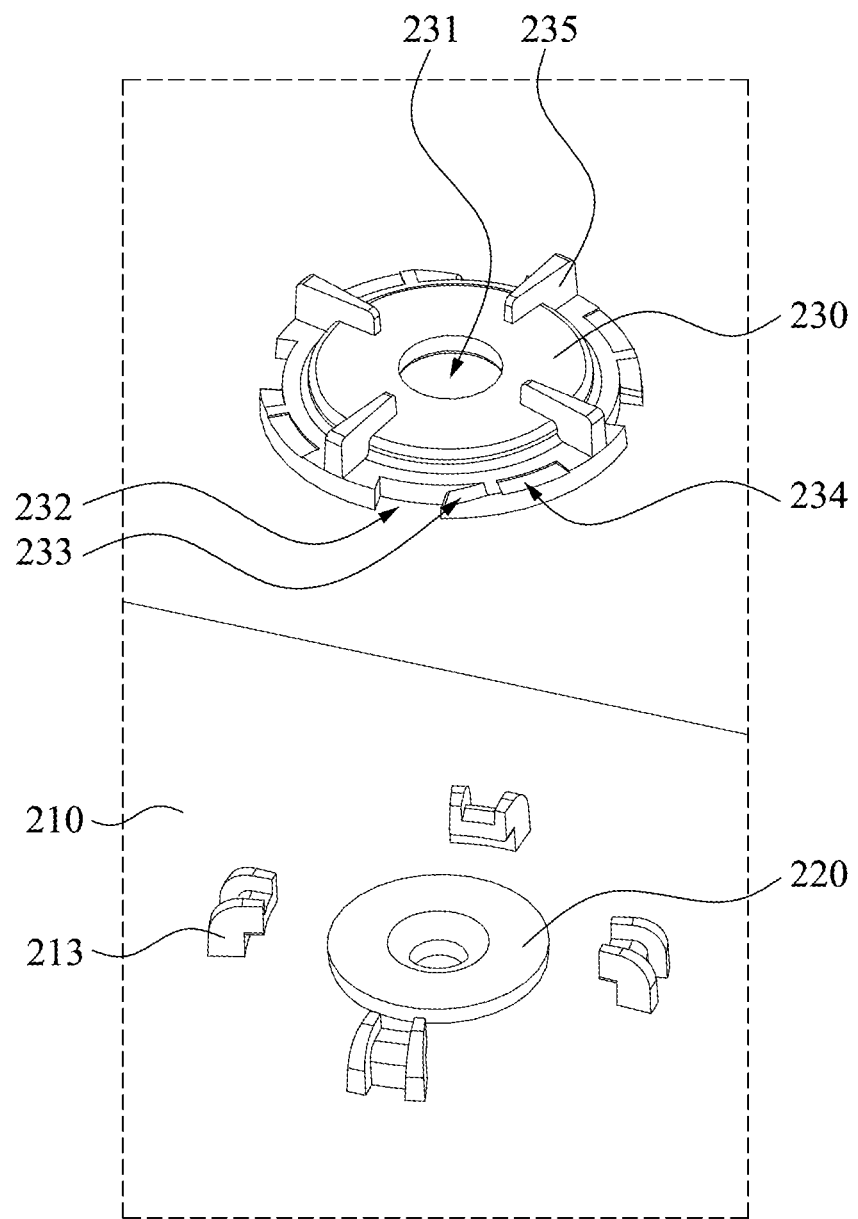

Please refer to FIGS. 5-8, which illustrate the casing 210, the gasket 220, and the cap 230 of the waterproof assembly 200 shown in FIG. 1 at different stages during the assembly of the waterproof assembly 200. FIG. 5 shows the casing 210, the gasket 220, and the cap 230 separate from one another prior to assembly. As shown in FIG. 6, an assembler first inserts the protruding portion 222 of the gasket 220 into the opening 211 of the casing 210. This operation also causes the first circular raised structures 223 (refer to FIGS. 2 and 4) of the gasket 220 to make contact with the second circular raised structures 212 at corresponding locations on the casing 210.

Figure 7:
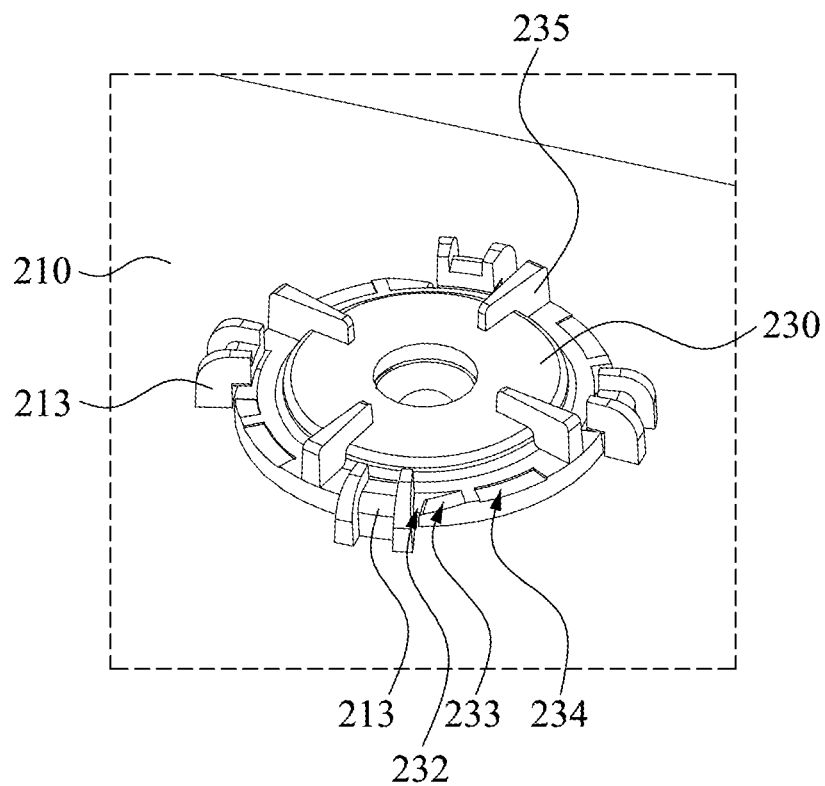

After joining the gasket 220 and the casing 210, as shown in FIG. 7, the assembler aligns the notches 232 of the cap 230 with the fixing members 213 of the casing 210 before putting down the cap 230. Consequently, the cap 230 may abut to the side of main body 221 away from the casing 210 without being obstructed by the fixing members 213.

Figure 8:
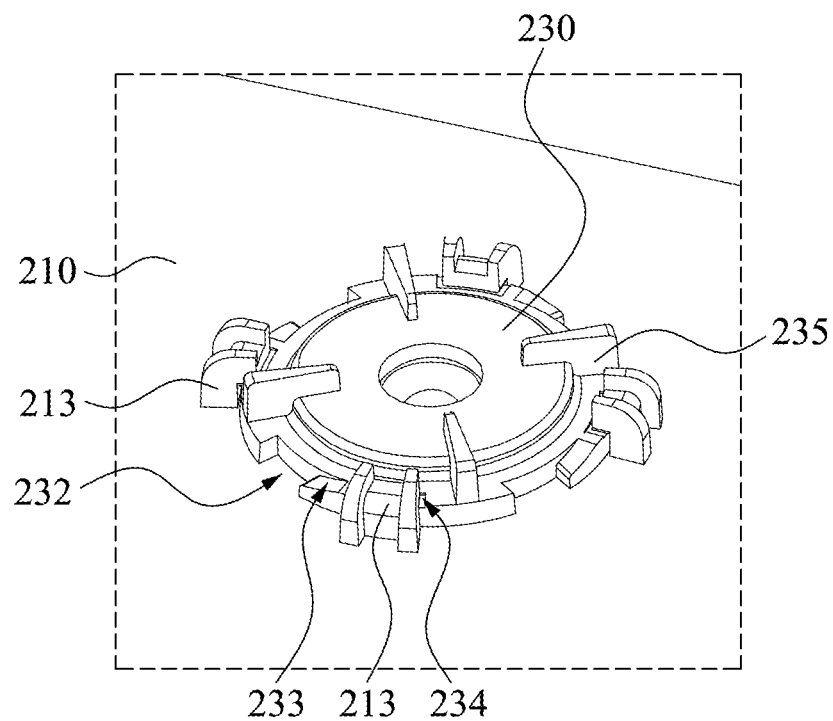

Subsequently, the gasket 220 is squashed when the assembler presses down the cap 230 and the first circular raised structure 223 and the second circular raised structure 212 tightly abut against each other thereby. Last, as shown in FIG. 8, the assembler rotates the cap 230 clockwise with an angle (e.g., 30 degrees). Each of the notches 232 moves away from a corresponding one of the fixing members 213 as the cap 230 is rotated, and the fixing members 213 abut to the side of the cap 230 away from the gasket 220 accordingly. The force exerted on the cap 230 and the gasket 220, which is provided by the fixing member 213, keeps the gasket 220 and the casing 210 in a tightly fitted state. The waterproof assembly 200 of the present disclosure is easy to assemble. Assembling the waterproof assembly 200 does not involve screwing and thus may be completed without any additional tools.

In some embodiments, as shown in FIGS. 7 and 8, the cap 230 also has a guiding bevel 233 connected to an end of a corresponding notch 232. An end of the guiding bevel 233 away from the notch 232 is greater in height (e.g., being aligned with a top surface of the cap 230, the top surface faces away from the gasket 220) and inclines downwards towards the notch 232. When rotating cap 230 (e.g., transitioning from the state shown in FIG. 7 to the state shown in FIG. 8), a corresponding fixing member 213 abuts to the guiding bevel 233 and moves along the guiding bevel 233 to climb to the top surface of the cap 230, gradually increasing the force exerted on the gasket 220.

In some embodiments, as shown in FIG. 8, the cap 230 also has a plurality of engaging slots 234. The engaging slots 234 are on the top surface of the cap 230 and each of the engaging slots 234 are located on a side of a corresponding guiding bevel 233 away from the notch 232. The engaging slots 234 are configured to engage with the fixing members 213 to limit the rotation of the cap 230. The engaging slots 234 can prevent inadvertent rotation of the cap 230, which may cause the gasket 220 to detach.

In some embodiments, as shown in FIG. 8, the cap 230 further has a plurality of flakes 235 protruding from the top surface of the cap 230. The flakes 235 are configured to be pushed by the assemblers, making it easier for the assemblers to apply force to rotate the cap 230.

Please refer back to FIG. 4. In some embodiments, the cap 230 further has a recess 236 (also refer to FIG. 2). When assembled, the recess 236 faces towards the gasket 220 and the main body 221 of the gasket 220 is located therein. A bottom surface of the recess 236 abuts against the main body 221 such that the main body 221 is compressed between the bottom surface of the recess 236 and the inner surface of the casing 210.

The way to fasten waterproof gasket by screw, as widely adopted by conventional waterproof structures, makes it hard for assemblers to control the extent to which the gaskets are compressed. The gaskets are frequently overly tightened, causing the gasket to be excessively compressed and experiencing plastic deformation, or loosely fastened, causing the waterproof capabilities of the gaskets to be worse than expected and allowing liquid to penetrate easily. The waterproof assembly 200 of the present disclosure can precisely control the amount of deformation of the main body 221 of the gasket 220 as squashed by the cap 230. The amount of deformation of the main body 221 depends on the depth of the recess 236.

In some embodiments, the depth of the recess 236 is in a range between 65% and 85% of an inherent thickness of the main body 221. The inherent thickness refers to the thickness of the main body 221 when being uncompressed (e.g., when being detached from the casing 210 and the cap 230). In other words, the recess 236 may be configured to control the compression to the main body 221 to fall between 15% and 35%. Incorporation of the recess 236 prevents the gasket 220 from being excessively compressed and experience plastic deformation, meanwhile keeping the main body 221 and the casing 210 tightly fitted, and thereby providing the waterproof assembly 200 with excellent waterproof and dustproof capability. In some embodiments, the waterproof assembly 200 has an IP67 rating waterproof and dustproof capability as defined by the International Protection Marking.

In sum, the waterproof assembly of the present disclosure utilizes the cap to press the gasket, thereby sealing the button opening on the casing. The cap is not only easy to install and remove, but it also does not excessively squash the gasket, thereby allowing the lifespan of the gasket to be extended.

Although the present disclosure has been disclosed by the above embodiments, the present disclosure is not limited thereto. Any person skilled in the art can make various changes and modifications without departing from the spirit and the scope of the present disclosure. Therefore, the protective scope of the present disclosure shall be the scope of the claims as attached.

What is claimed is:

1. A waterproof assembly, comprising:
   a casing having an opening;
   a gasket comprising:
      a main body having a first circular raised structure, wherein the first circular raised structure is configured to abut against an inner surface of the casing; and
      a protruding portion connected to the main body and configured to at least partially protrude out of the casing through the opening; and
   a cap that is configured to abut against a side of the main body away from the opening and has a through hole configured to be aligned with the protruding portion,
   wherein the casing further has a plurality of fixing members configured to abut against a side of the cap away from the gasket;
   wherein a peripheral edge of the cap has a plurality of notches, wherein the cap further has a guiding bevel connected to an end of one of the notches, and one of the fixing members is configured to abut against and move along the guiding bevel.

2. The waterproof assembly of claim 1, wherein the casing further has a second circular raised structure disposed on the inner surface of the casing and surrounding the opening, and the first circular raised structure and the second circular raised structure are configured to abut against each other.

3. The waterproof assembly of claim 1, wherein the cap further has a recess facing towards the gasket, and the main body of the gasket is configured to be accommodated in the recess and abut against a bottom surface of the recess.

4. The waterproof assembly of claim 3, wherein the main body has a thickness, and a depth of the recess is in a range between 65% and 85% of the thickness of the main body.

5. The waterproof assembly of claim 1, wherein the cap further has an engaging slot configured to engage with one of the fixing members.

6. The waterproof assembly of claim 1, wherein the cap further has a plurality of flakes protruding from a top surface of the cap, the top surface faces away from the gasket.

7. The waterproof assembly of claim 1, wherein the main body surrounds and connects the protruding portion, and the first circular raised structure surrounds the protruding portion.

8. The waterproof assembly of claim 1, wherein a material of the gasket comprises silicone rubber.

9. A waterproof assembly applied to an outdoor network device, the waterproof assembly comprising:
  a casing having an opening;
  a gasket comprising:
    a main body having a first circular raised structure, wherein the first circular raised structure is configured to abut against an inner surface of the casing; and
    a protruding portion connected to the main body and configured to at least partially protrude out of the casing through the opening;
  a cap that is configured to abut against a side of the main body away from the opening and has a through hole configured to be aligned with the protruding portion; and
  a circuit board disposed inside the casing and having a button, wherein the button is configured to pass through the through hole and extend to an inner side of the protruding portion,
  wherein the casing further has a plurality of fixing members configured to abut against a side of the cap away from the gasket;
  wherein a peripheral edge of the cap has a plurality of notches, wherein the cap further has a guiding bevel connected to an end of one of the notches, and one of the fixing members is configured to abut against and move along the guiding bevel.

* * * * *